(12) United States Patent
Lorenz

(10) Patent No.: US 6,175,276 B1
(45) Date of Patent: *Jan. 16, 2001

(54) INDIRECT EMITTER-COUPLING PREAMPLIFIER FOR MAGNETO-RESISTIVE HEADS WITH SINGLE-ENDED FEEDBACK

(75) Inventor: Perry S. Lorenz, Sunnyvale, CA (US)

(73) Assignee: National Semiconductor Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/042,593

(22) Filed: Mar. 16, 1998

(51) Int. Cl.$^7$ ....................................... H03F 3/45
(52) U.S. Cl. ........................... 330/260; 330/294; 330/85; 330/258
(58) Field of Search ............................. 330/85, 252, 258, 330/260, 294

(56) References Cited

U.S. PATENT DOCUMENTS

| | | | |
|---|---|---|---|
| 3,541,465 | * 11/1970 | Nagata et al. | 330/258 |
| 4,528,517 | * 7/1985 | Schlotzhauer | 330/258 |
| 4,752,744 | * 6/1988 | Aoki | 330/260 |
| 4,833,418 | * 5/1989 | Quintus et al. | 330/258 |
| 5,635,874 | * 6/1997 | Perrot | 330/260 |
| 5,729,178 | * 3/1998 | Park et al. | 330/258 |

OTHER PUBLICATIONS

Smith et al. "Distributed Components in Printed Circuit" Proceedings Electronics Components Syposuim 1956 Washington, DC.*

* cited by examiner

Primary Examiner—Michael B. Shingleton
(74) Attorney, Agent, or Firm—Skjerven Morrill MacPherson LLP; Edward C. Kwok; Carmen C. Cook

(57) ABSTRACT

A preamplifier amplifies a differential signal from a magneto-resistive read head. The preamplifier is designed to maximize gain and minimize introduction of noise, while maintaining wide bandwidths and common mode rejection performance. The emitters of the differential amplifier are coupled together by a third transistor and a capacitor.

14 Claims, 4 Drawing Sheets

INDIRECT EMITTER-COUPLING PREAMPLIFIER FOR MAGNETO-RESISTIVE HEADS WITH SINGLE-ENDED FEEDBACK

BACKGROUND OF THE INVENTION

1. Field of the Invention

This invention relates to amplifiers in general; and, in particular, to preamplifiers for read heads in magnetic disk drives.

2. Discussion of the Related Art

The preamplifier in this application processes a differential signal from a magneto-resistive read head for a disk drive. In addition to signal amplification, the preamplifier contributes noise. If the preamplifier has a high gain, noise introduced by subsequent stages can be rendered, as compared to noise introduced by the preamplifier, relatively insignificant. Thus, noise in a preamplifier should be minimized, while the preamplifier must also maximize gain and bandwidth.

FIG. 1 shows a prior art preamplifier 100 receiving a differential signal across terminals 110 and 111, which are amplified by differential stages 100a and 100b. Differential stages 100a and 100b include emitter-coupled transistor pairs 101 and 102, and 105 and 106. Differential stages 100a and 100b are used because of the high gain required. For example, a bias of several hundred millivolts in the differential signal across terminals 110 and 111 (i.e., the signal provided by the read head) can exceed the rail-to-rail voltage. However, preamplifier 100 of FIG. 1 is undesirable because of the noise in four transistors.

As shown in FIG. 1, each of differential stages 100a and 100b is used as a single-ended amplifier. The signal at terminal 110 is coupled to the base terminal of transistor 101 and the signal at terminal 111 is coupled to base terminal of transistor 105. Current sources 113 and 114 provide bias currents to differential stages 100a and 100b, respectively. Transistors 115–118, which are each biased by a common reference voltage source 119, form cascodes to provide an AC ground. Differential amplifiers 120 and 121 drive differential stages 100a and 100b respectively to provide an output differential voltage at terminals 122 and 123. Capacitors 124 and 125 filters out high frequency AC noise signals in input terminals 110 and 111, respectively. Resistors 126–129 are typically given the same resistance.

Preamplifier 100's gain can be set by selecting a suitable resistance value for resistors 126–129. Roughly, the gain is determined by the ratio of this selected resistance to the emitter resistance in each of transistors 101, 102, 105 and 106. Gain is increased by a higher resistance or a larger current in each of transistors 115–118.

Since differential stages 100a and 100b are essentially two single-ended amplifiers, preamplifier 100 does not have a good common mode rejection characteristics.

FIG. 2 shows a preamplifier 150 in the prior art, which is a variation of preamplifier 100, for use with multiple read heads. (To simplify discussion, like elements in the figures of the application are provided like reference numerals.) In preamplifier 150, multiple differential signals from multiple read heads share differential stages 150a and 150b. For example, as shown in FIG. 2, the differential output signal from a first read head is provided at terminals 110 and 111 and coupled into differential stages 150a and 150b via the base terminals of transistors 101 and 105, respectively. In like manner, the differential output signal of a second read head is provided at terminals 151 and 152 and coupled into differential stages 150a and 150b via the base terminals of transistors 153 and 154, respectively. A mechanism (not shown) is provided to select which one of the output differential signals from the multiple read head is coupled into preamplifier 150.

To minimize shot noise, transistors 101, 102, 115 and 116 are made as large as practical. At the same time, however, without reducing the resistances in resistors 126–129, increasing the currents in transistors 101, 102, 115 and 116 limits the dynamic range of the output signals. Reducing the resistances of resistors 126–129 reduces the gain of the preamplifier.

SUMMARY OF THE INVENTION

In accordance with the present invention, a preamplifier includes (i) an indirectly coupled transistor pair receiving an input differential signal and (ii) an AC coupling circuit indirectly coupling the transistors of the pair to each other.

In one embodiment, a current bypass circuit is also included for decreasing the emitter resistance and raising the gain while observing voltage overhead restrictions.

Thus, the present invention provides indirect AC coupling of a transistor pair in a preamplifier, allowing the preamplifier to function with fewer primary noise-contributing transistors and to perform common mode rejection.

The present invention is better understood upon consideration of the detailed description below and the accompanying drawings.

DETAILED DESCRIPTION OF THE PREFERRED EMBODIMENTS

Figure 3A:
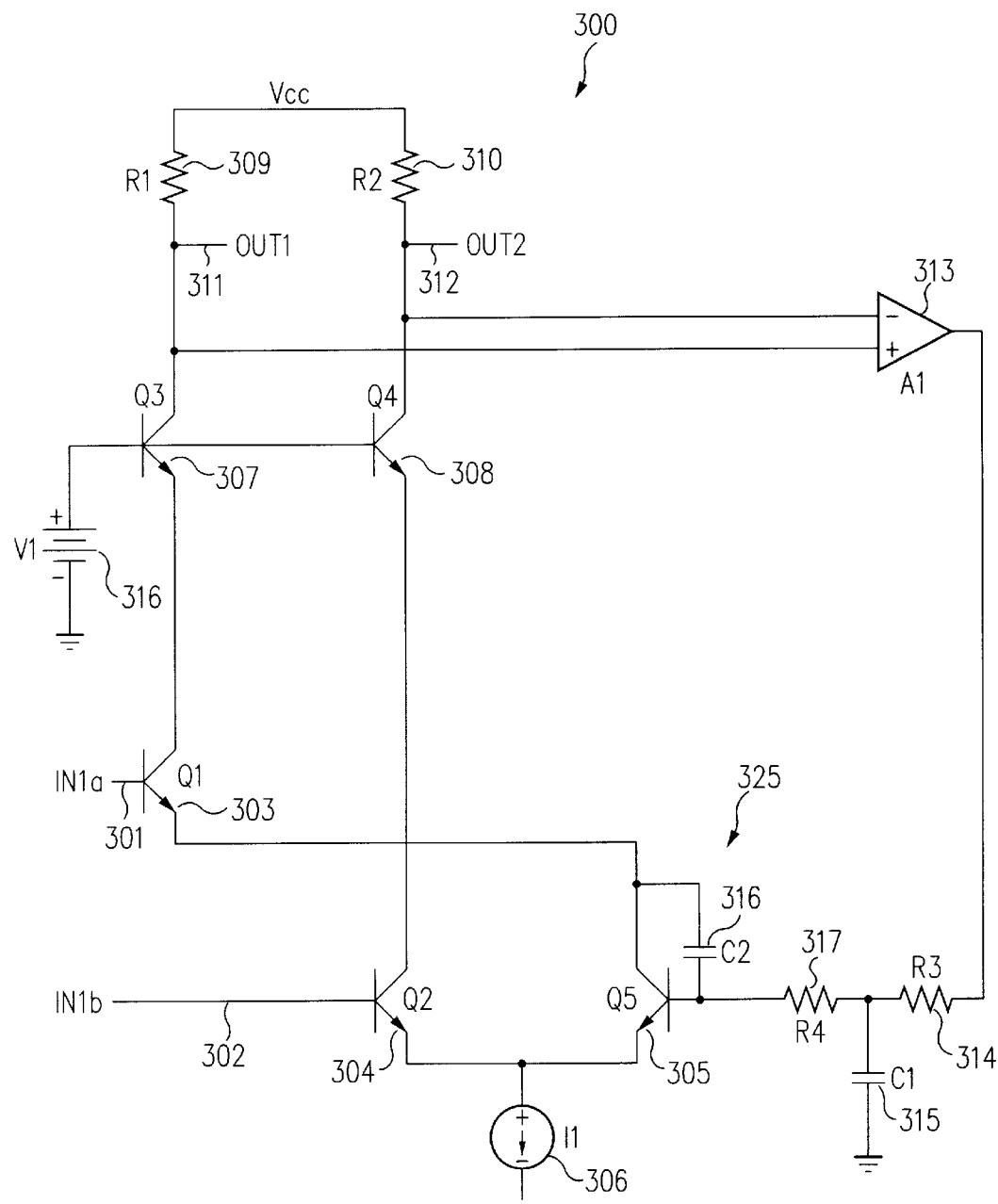
FIG. 3a shows a preamplifier circuit 300 in accordance with one embodiment of the invention.

One embodiment of the present invention is shown in preamplifier circuit 300 of FIG. 3a. In preamplifier 300, an input differential signal from a read head (not shown) appears across terminals 301 and 302, which are respectively coupled into the base terminals of transistors 303 and 304, respectively. A current source 306 provides a bias current split between transistors 303 and 304. The present invention indirectly couples the input differential signal of terminals 301 and 302 through an AC coupling circuit 325 to provide an output differential signal at terminals 311 and 312. AC coupling circuit 325 includes transistor 305 and capacitor 316.

In preamplifier 300, feedback amplifier 313 provides the base current of transistor 305, based on the differential output signal across terminals 311 and 312. The low-pass filter formed by capacitor 315 and resistor 314 filters out high frequency AC signals. In addition, resistor 317 isolates capacitors 315 and 316, such as to allow a dynamic range of voltage at the base terminal of transistor 305 in response to feedback to the output differential signal across terminals 311 and 312

In one embodiment, capacitor 316 is provided integrally with the other components of preamplifier 300 on an integrated circuit, thereby eliminating inductance and a potential bandwidth limitation resulting from an external capacitor. For an AC signal (i.e., a signal of a frequency between DC and less than the frequency attenuated by the low-pass filter of resistor 314 and capacitor 315), AC coupling circuit 325 behaves like a diode between the emitter of transistor 303 and the emitter terminal of transistor 304, having a coupling impedance of $r_e$, which is the same emitter resistance as either of the emitter resistances of transistors 303 and 304. Consequently, the emitter impedance of preamplifier 300 is 50% higher, and hence the gain 50% lower, than a similarly size differential stage, such as differential stage 100a of the prior art.

Figure 1:
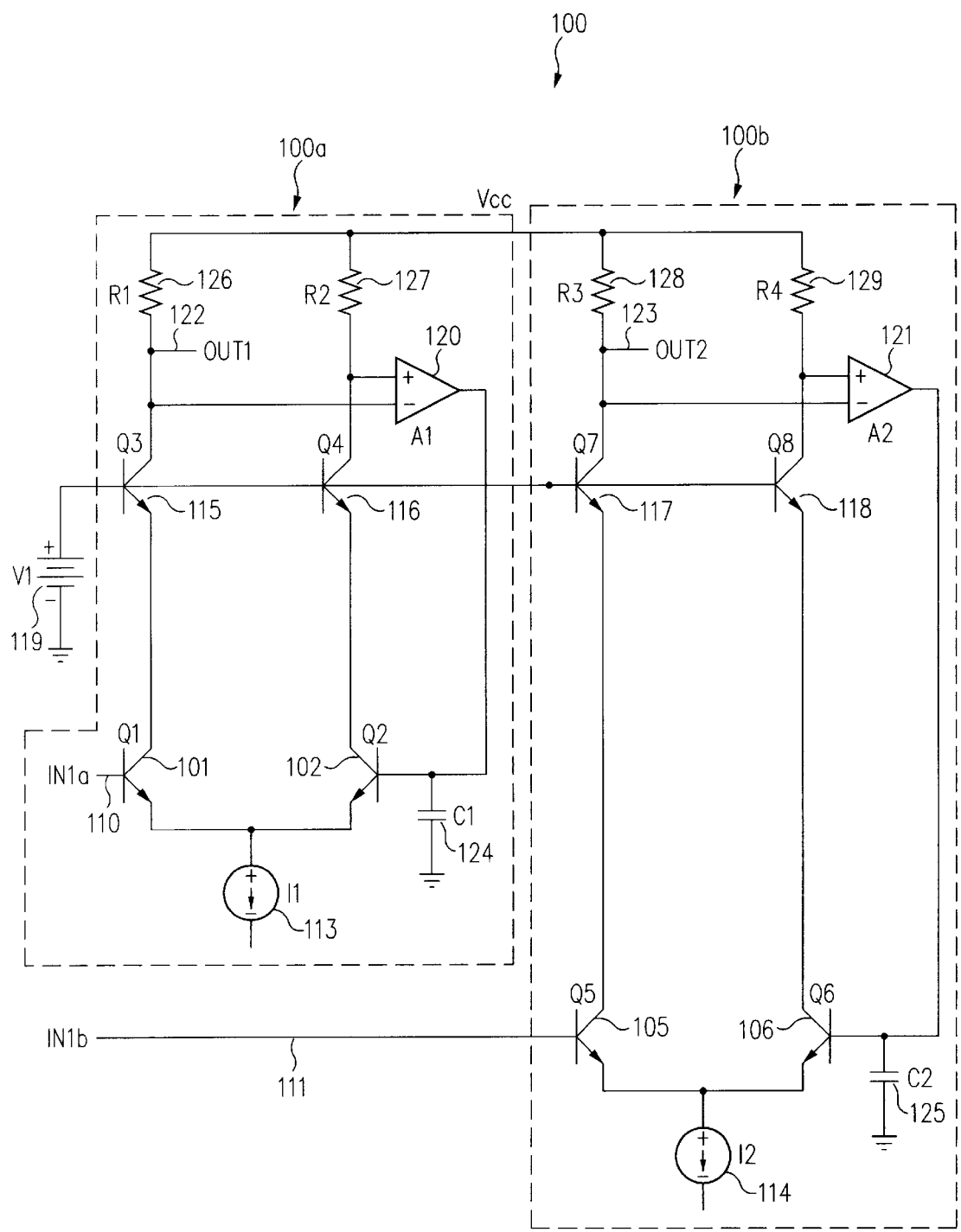
FIG. 1 is a prior art preamplifier using two emitter-coupled pairs.
Figure 2:
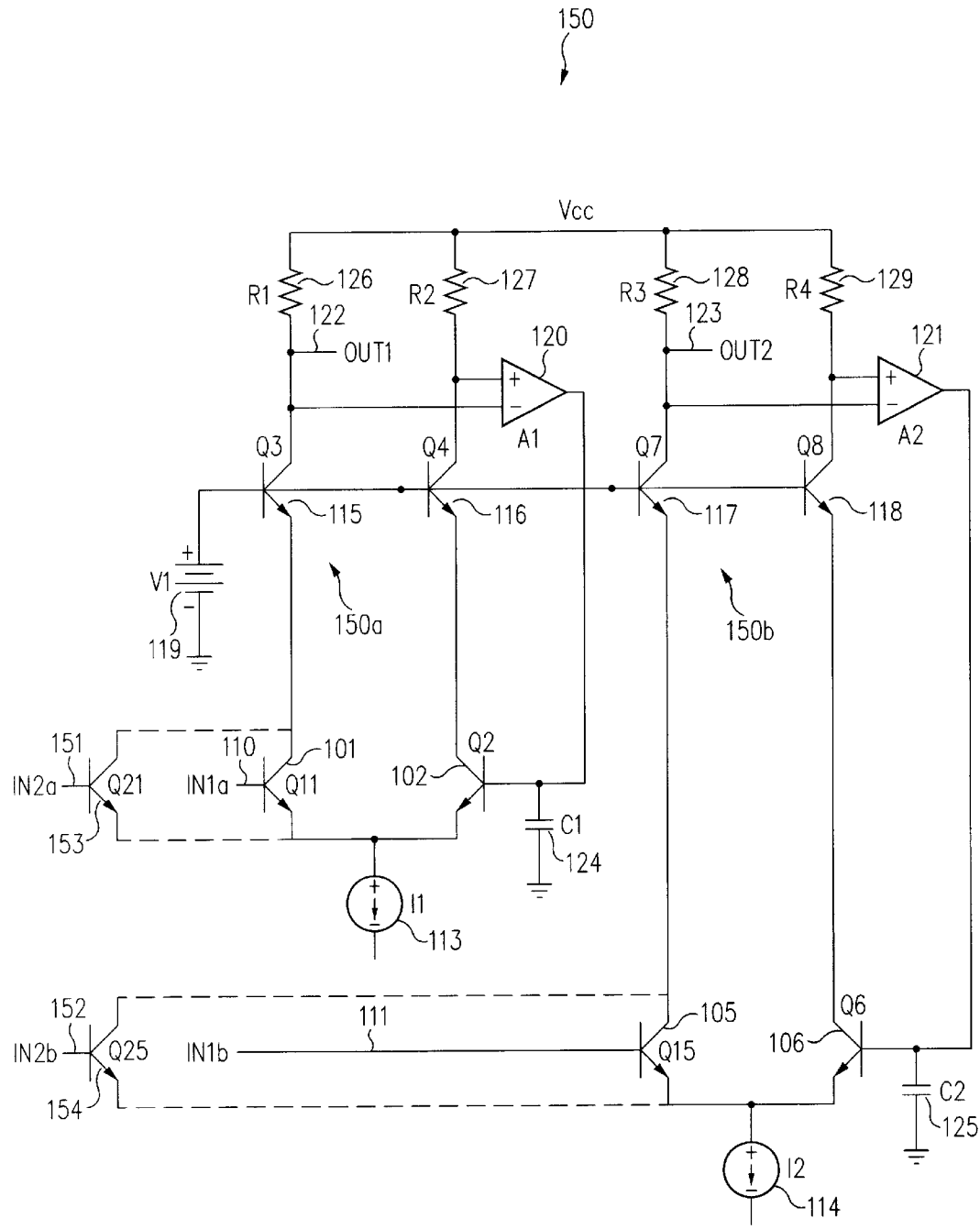
FIG. 2 is a prior art preamplifier for a disk drive with multiple read heads.

However, since only three transistors (i.e., transistors 303, 304 and 305) are involved in amplifying the differential input signal across terminals 301 and 302, rather than four transistors, as in the prior art preamplifier 100 of FIG. 1, this reduction in the number of noise-contributing transistors represents a significant improvement in performance.

Transistors 307 and 308 are coupled to the collector terminals of transistors 303 and 304 respectively. Although not necessary for some applications, transistors 303 and 304 provide additional bandwidth for wide bandwidth applications. Voltage source 316 biases transistors 307 and 308 and provides an AC ground.

The gain of preamplifier 300 is largely determined by the resistances of resistors 309 and 310 in relation to emitter resistances (i.e., $r_e$) of transistors 303, 304 and 305. The current in current source 306 can be selected to provide a predetermined dynamic range for the output differential signal across terminals 311 and 312. Alternatively, resistors 309 and 310 can be eliminated, if the emitter currents of transistors 304 and 305 is used as a differential current signal.

Preamplifier 300 exhibits a higher common mode rejection performance than prior art preamplifier 100.

Figure 3B:
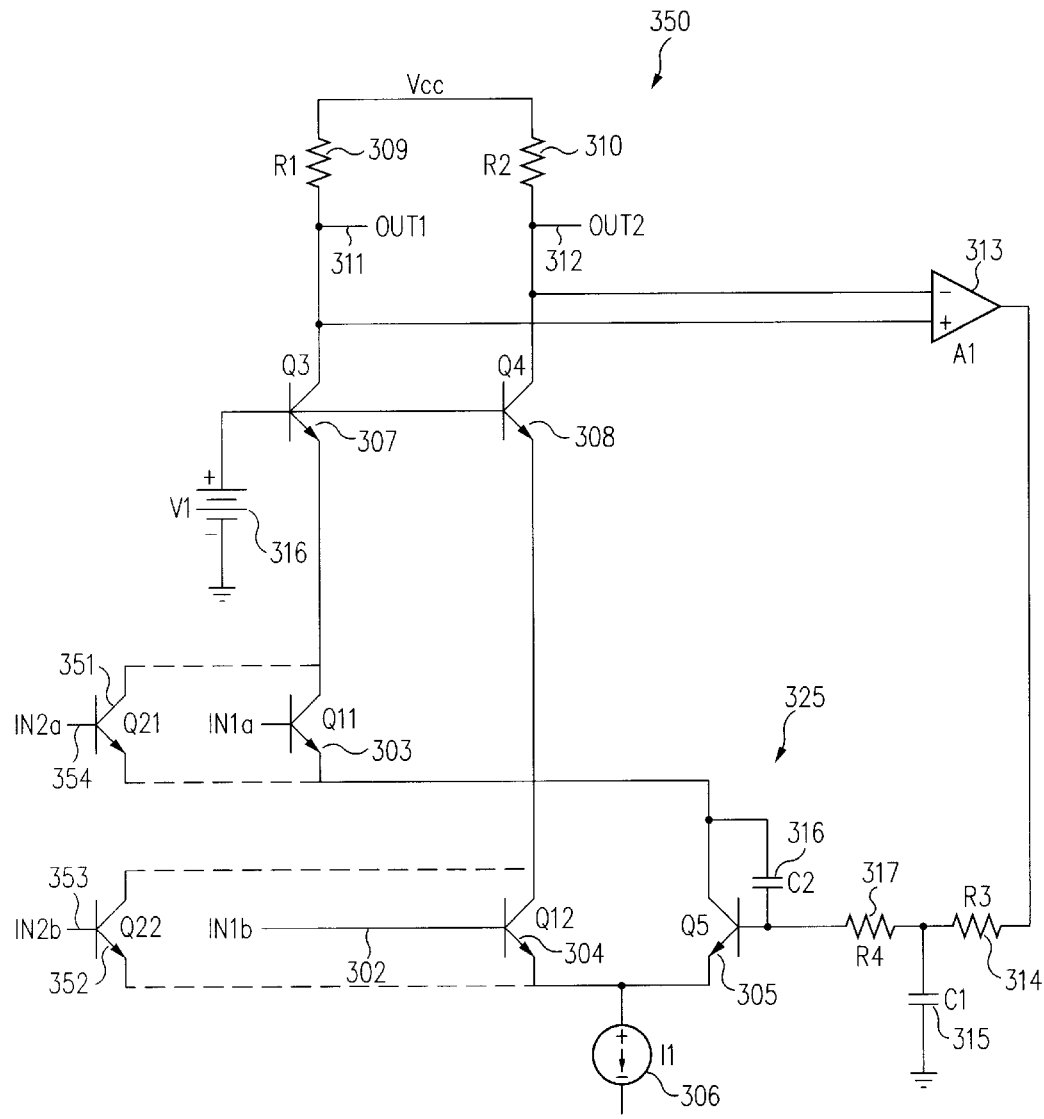
FIG. 3b shows a preamplifier circuit 350, which is a variation of preamplifier circuit 300 of FIG. 3a, accommodating multiple read heads.

FIG. 3b shows a preamplifier 350, which is a variation of preamplifier 300 of FIG. 3a, accommodating multiple read heads. To simplify discussion, elements of preamplifier circuits 300 and 350 in FIGS. 3a and 3b, respectively, which perform substantially similar functions are provided like reference numerals.

The above-detailed descriptions are provided to illustrate the specific embodiments of the present invention and is and not intended to be limiting. Various modifications and variations within the scope of the present invention are possible. The present invention is set forth in the following claims.

I claim:

1. An amplifier comprising:
   a differential stage receiving a feedback signal, including first and second input terminals for receiving an input differential signal, and first and second output terminals for providing a differential output signal indicative of the input differential signal;
   a differential amplifier receiving said differential output signal, and providing a single-ended amplified output signal indicative of said differential output signal; and
   a coupling circuit comprising a first transistor and a low pass filter, said low pass filter for receiving said single-ended amplified output signal, filtering said amplified signal, and providing a filtered amplified output signal through said first transistor to said differential stage as said feedback signal.

2. The amplifier of claim 1, wherein said low pass filter comprises a resistance and a capacitor.

3. The amplifier of claim 1, wherein said differential stage includes a first current path and a second current path, said differential stage further comprises first and second transistors in said first and second current paths, respectively, said first and second transistors each being controlled by a voltage source to provide an AC ground.

4. The amplifier of claim 1, wherein said coupling circuit couples a signal within a predetermined frequency range into said differential stage.

5. The amplifier of claim 4, wherein said differential stage comprises a first current path and a second current path controlled by said input differential signal, said signal of a predetermined frequency being coupled into said first current path through a base terminal of said first transistor.

6. The amplifier of claim 5, said coupling circuit further comprising a capacitor coupled between a collector terminal of said first transistor and an output terminal of said low-pass filter.

7. The amplifier of claim 1, wherein said differential stage includes a first current path and a second current path, said differential stage further comprises first and second resistors in said first and second current paths, respectively.

8. An amplifier comprising:
   a differential stage receiving a feedback signal, including first and second transistors, first and second input terminals each coupled to a control terminal of said first and second transistors respectively for receiving an input differential signal, and first and second output terminals for providing a differential output signal indicative of the input differential signal;
   a differential amplifier receiving said differential output signal, and providing a single-ended amplified output signal indicative of said differential output signal; and
   a coupling circuit, receiving said single-ended amplified output signal, and including a low pass filter for filtering said single-ended amplified output signal and a third transistor coupling into said differential stage said filtered single-ended amplified output signal as said feedback signal.

9. The amplifier of claim 8, said coupling circuit further comprising a capacitor coupled between an emitter terminal of said first transistor and a base terminal of said third transistor.

10. The amplifier of claim 8, wherein said low pass filter further comprises a resistance and a capacitor.

11. The amplifier of claim 8, wherein said coupling circuit couples a signal within a predetermined frequency range into said differential stage.

12. The amplifier of claim 11, wherein said differential stage comprises a first current path and a second current path controlled by said input differential signal, said signal of a predetermined frequency being coupled into said first current path through a base terminal of said third transistor.

13. The amplifier of claim 8, wherein said differential stage includes a first current path and a second current path, said differential stage further comprises fourth and fifth transistors in said first and second current paths, respectively, said fourth and fifth transistors each being controlled by a voltage source to provide an AC ground.

14. The amplifier of claim 8, wherein said differential stage includes a first current path and a second current path, said differential stage further comprises first and second resistors in said first and second current paths, respectively.

* * * * *